(12) United States Patent
Mueller et al.

(10) Patent No.: US 7,679,151 B2
(45) Date of Patent: Mar. 16, 2010

(54) MICROMECHANICAL DEVICE AND METHOD FOR MANUFACTURING A MICROMECHANICAL DEVICE

(75) Inventors: Karlheinz Mueller, Velden (DE); Bernhard Winkler, Munich (DE)

(73) Assignee: Infineon Technologies AG, Munich (DE)

( * ) Notice: Subject to any disclaimer, the term of this patent is extended or adjusted under 35 U.S.C. 154(b) by 110 days.

(21) Appl. No.: 11/668,743

(22) Filed: Jan. 30, 2007

(65) Prior Publication Data

US 2007/0184624 A1 Aug. 9, 2007

(30) Foreign Application Priority Data

Jan. 30, 2006 (DE) .................. 10 2006 004 209

(51) Int. Cl.
*H01L 29/06* (2006.01)

(52) U.S. Cl. .............. 257/414; 257/415; 257/416; 257/417; 257/418; 257/419; 257/420; 257/421; 257/619; 257/E29.324; 438/50; 438/52; 438/53; 438/409; 438/411

(58) Field of Classification Search ............ None
See application file for complete search history.

(56) References Cited

U.S. PATENT DOCUMENTS

| 5,798,283 | A | * | 8/1998 | Montague et al. | ............ 438/24 |
| 5,834,333 | A | * | 11/1998 | Seefeldt et al. | ............ 438/52 |
| 7,372,115 | B2 | * | 5/2008 | Baney | ............ 257/419 |
| 2002/0094435 | A1 | * | 7/2002 | Artmann et al. | ............ 428/332 |
| 2006/0108652 | A1 | * | 5/2006 | Partridge et al. | ............ 257/414 |

* cited by examiner

*Primary Examiner*—Minh-Loan T Tran
*Assistant Examiner*—Fei Fei Yeung Lopez
(74) *Attorney, Agent, or Firm*—Eschweiler & Associates, LLC

(57) ABSTRACT

In a method for manufacturing a micromechanical device having a region for forming an integrated circuit, at first a first layer is produced on a deeper-lying part in the substrate. Subsequently, a membrane layer is produced on the first layer and at least one channel completely penetrating the membrane layer is introduced in the membrane layer. After that, a region of the first layer below the membrane layer is removed to form a cavity. Finally, the channel is sealed and a planar surface is formed.

11 Claims, 3 Drawing Sheets

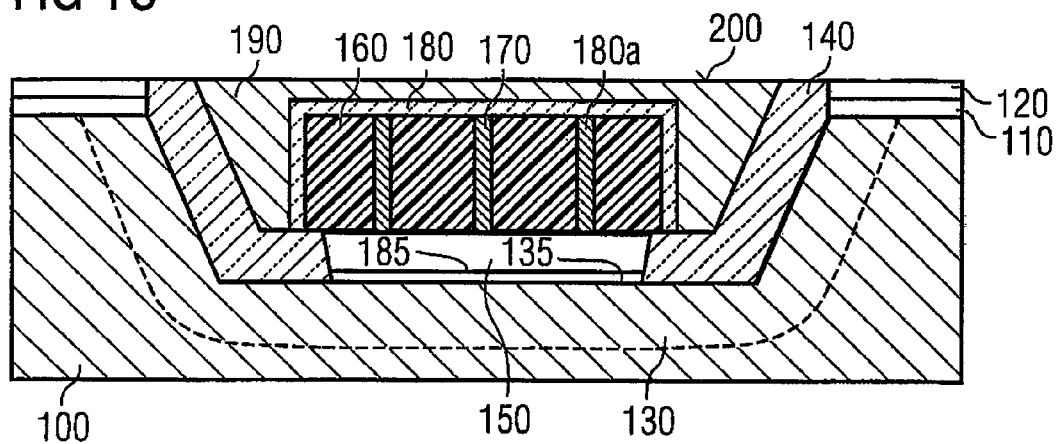
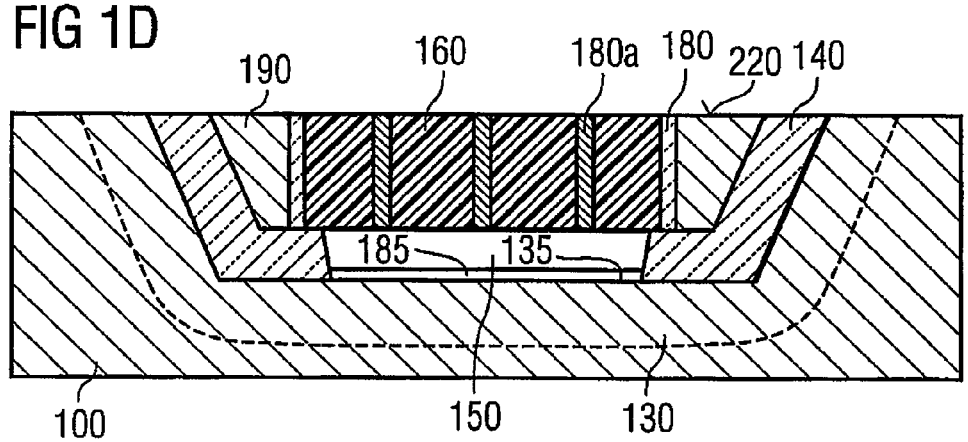

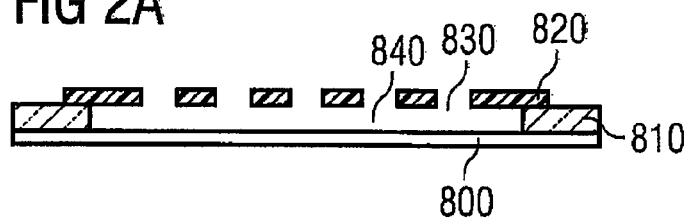
FIG 2A
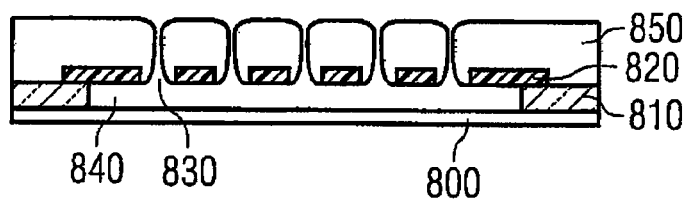
FIG 2B
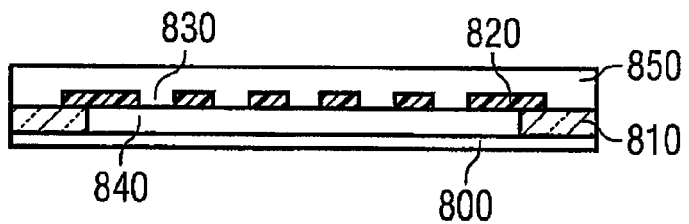
FIG 2C
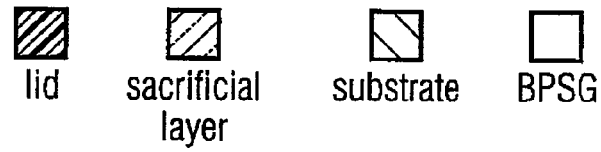
FIG 3
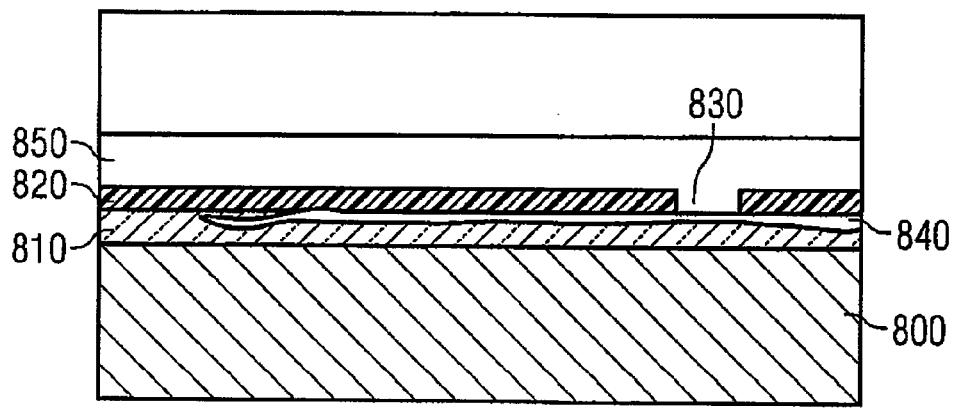

MICROMECHANICAL DEVICE AND METHOD FOR MANUFACTURING A MICROMECHANICAL DEVICE

CROSS-REFERENCE TO RELATED APPLICATIONS

This application claims priority from German Patent Application No. 10 2006 004 209.3, which was filed on Jan. 30, 2006, and is incorporated herein by reference in its entirety.

TECHNICAL FIELD

The present invention relates to a micromechanical device and to a method for manufacturing a micromechanical device, in particular to a micromechanical device having a region for forming integrated circuits, i.e., for example, micromechanical sensors, such as, for example, integrated pressure sensors or integrated acceleration sensors.

BACKGROUND

In surface micromechanics, there is a possibility, when manufacturing integrated sensor elements, to produce cavities for such devices along with other electrical devices in an integrated circuit. Thus, the process steps for manufacturing the micromechanics components (micromechanics process steps) are partly of considerable influence for the characteristics of the electrical devices processed. One consequence frequently resulting is a limitation in the degrees of freedom in the process management for manufacturing and sealing cavities in these devices. The result is that disadvantages in the characteristics of the micromechanical devices partly have to be put up with. An example of such a limitation or a disadvantage in the characteristics of such a micromechanical device is that it might be of particular importance, in particular in modern processes and devices, for the doping profiles provided not to be shifted.

At present, two-chip solutions are predominantly used to solve these problems, one chip containing the micromechanical structures and a second chip containing evaluating electronics for processing the signals obtained from the first chip. The two devices are processed separately. A mutual process influencing in the form of process influences of the respective other manufacturing processes can be avoided here. The disadvantage of this solution, however, is considerable additional cost resulting from the separate process management and the separate chips. In addition, additional package expenditure results from the separate processing of the two chips, which increases the setup space of the finished device on the one hand and the manufacturing cost on the other hand. Furthermore, certain applications which are, for example, dependent on evaluating particularly small signals cannot be realized by this concept since the respective signals, for example, must be transported via bond wires via which it is particularly easy for disturbance signals to couple in the sensor.

Another solution will be described and discussed in greater detail referring to the schematic setup shown in FIG. 2 and the scanning electron microscope image shown in FIG. 3. The cavity structures here are processed after manufacturing the electrical devices. Mutual process influences in this case result in partly complicated readjusting of the electronical devices.

A cavity can be exposed by etching by a plate provided with holes which may, for example, consist of polysilicon (poly Si), silicon oxide (Si oxide) or silicon nitride (Si nitride). FIG. 2a shows this intermediate state of an integrated sensor element in a schematic manner. A sacrificial layer 810 which in the finished device acts as a spacing for the membrane layer 820 which in FIG. 2a is also referred to as a lid is applied on a substrate 800. The membrane layer 820 has a plurality of holes 830. A cavity 840 has been exposed by etching through the holes 830. Thus, FIG. 2a shows a cavity 840 exposed by etching comprising a lid 820 provided with holes. Subsequently, as is shown in FIG. 2b, a sealing layer 850 is applied on the membrane layer 820 and the sacrificial layer 810, wherein the sealing layer has not completely sealed the holes 830 in the membrane layer. A highly doped silicate glass, such as, for example, borophosphosilicate glass (BPSG) or phosphosilicate glass (PSG), is frequently used as a sealing layer material. FIG. 2b is a schematic representation of the device after BPSG deposition. In a subsequent process step, the device is heated, whereupon the sealing layer 850 becomes viscous and seals the holes 830, as is schematically shown in FIG. 2c. FIG. 2c is a schematic representation of the device after BPSG reflow. Apart from the basic illustration shown in FIG. 2, FIG. 3 shows a scanning electron microscope (SEM) image of a cross-section of a corresponding device including a cavity produced in this manner. In the device shown in FIG. 3, the cavity structure has been sealed by BPSG. Reference numerals used in FIG. 2 are also used for corresponding structures of FIG. 3. This manufacturing concept is, for example, described in the patent document DE 10022266 A1.

After exposing by etching the cavity 840 through the plate provided with holes or membrane layer 820, this plate or the holes 830 of the membrane layer 820 are sealed by a highly doped silicate glass, such as, for example, PSG or BPSG. Sealing by a highly doped silicate glass is possible here since this material becomes viscous at high temperatures, in the case of BPSG usually starting at around 700° C., and behaves like a well-wetting liquid. Its surface tension compensates unevenness in the topology and seals small apertures, in the present case the holes 830, in a gas-tight manner. This process step is also referred to as "reflow".

Highly doped silicate glass which, in principle, is suitable for sealing a cavity, however, can only be used after manufacturing the electrical devices, the so-called basic process, since the highly doped silicate glass entails a very high contamination danger for the (processed) device. Even this cavity manufacturing process, comprising the sub-step of reflow which is performed after the basic process, usually influences the integrated circuit contained on the wafer and/or the electrical devices processed so that the characteristics, such as, for example, resistances, capacitances or other electrical, mechanical, optical, acoustic or different physical quantities, thereof may be altered in an unpredictable manner, which is a considerable disadvantage of this manufacturing process.

Gas-tight sealing by depositing an undoped oxide is also possible in principle, however only under very difficult conditions, since growth lines will always form here in the deposition process. In addition, undoped oxides do not exhibit a flow behavior at high temperatures, so that apertures or holes can consequently only be sealed by relatively large layer thicknesses since a hole must grow to be sealed already during deposition. Sealing apertures or holes afterwards by reflow is not possible in this case.

SUMMARY

According to an embodiment, a method for manufacturing a micromechanical device comprising a region for forming an integrated circuit, comprises: producing a first layer on a substrate; producing a membrane layer on the first layer; introducing at least one channel into the membrane layer, the channel completely penetrating the membrane layer; removing a region of the first layer below the membrane layer to form a cavity; sealing the at least one channel; and forming a planar surface.

BRIEF DESCRIPTION OF THE DRAWINGS

Preferred embodiments of the present invention will be detailed subsequently referring to the appended drawings, in which:

FIGS. 1a-1d show a schematic illustration of the inventive method for manufacturing a micromechanical device;

FIGS. 2a-2c show a schematic illustration of a prior method for manufacturing a micromechanical device; and FIG. 3 shows a scanning electron microscope image of a micromechanical device manufactured according to the method of FIG. 2.

DETAILED DESCRIPTION

Figure 1A:
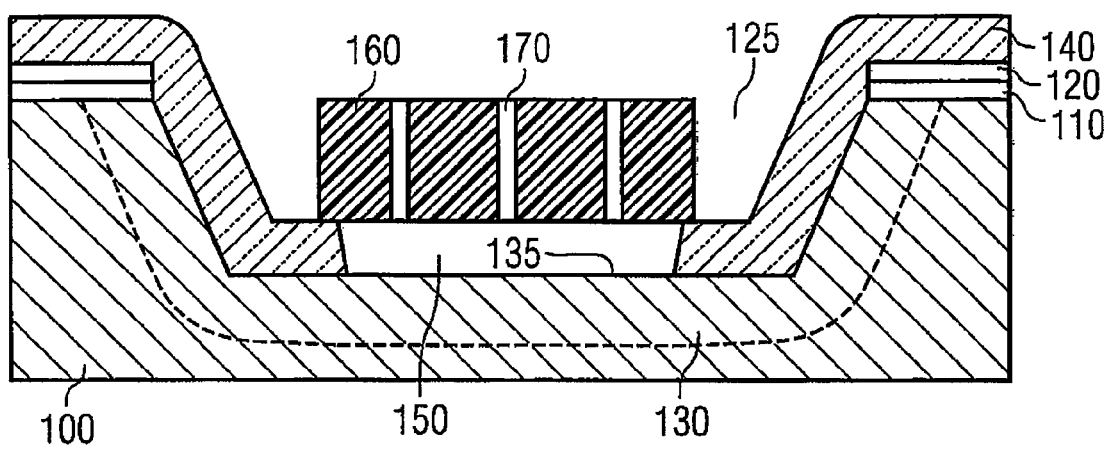

According to an embodiment, a method for manufacturing a micromechanical device having a region for forming an integrated circuit, may have the steps of: producing a recess in a substrate; producing a first layer in the recess; producing a membrane layer on the first layer; introducing at least one channel into the membrane layer, the channel completely penetrating the membrane layer; removing a region of the first layer below the membrane layer to form a cavity; sealing the at least one channel; and forming a planar surface, wherein the first layer and the membrane layer are produced in the recess such that the cavity is located in the recess.

According to another embodiment, a micromechanical device having a region for forming an integrated circuit, may comprise: a recess in the substrate; a first layer in the recess; a membrane layer on the first layer, the membrane layer covering a cavity in the first layer; and a planar surface, wherein the region for forming the integrated circuit is outside a region in which the membrane layer is formed; and wherein the first layer and the cavity are located in the recess.

According to another embodiment, a method for manufacturing a micromechanical device having a region for forming an integrated circuit, may have: producing a first layer on a substrate; producing a membrane layer on the first layer; introducing at least one channel into the membrane layer, the channel completely penetrating the membrane layer; removing a region of the first layer below the membrane layer to form a cavity; sealing the at least one channel; and forming a planar surface.

According to yet another embodiment, a micromechanical device having a region for forming an integrated circuit, may have: a first layer on a substrate; a membrane layer on the first layer, the membrane layer covering a cavity in the first layer; and a planar surface, wherein the region for forming the integrated circuit is outside a region in which the membrane layer is formed.

The present invention solves the problem of influencing the characteristics of the integrated circuit by processing the cavity structures and/or the cavity before the electrical devices in the form of integrated circuits in an integrated process so that the influence of the cavity manufacturing on the electrical characteristics is reduced as far as possible. By de-coupling the manufacturing steps for manufacturing the cavity and the manufacturing steps for manufacturing the integrated circuits, i.e. the two process modules, the cavity sealing can be realized by the sealing process according to an embodiment without a flowable material. Preferably, according to an embodiment, the cavity can be sealed by further oxidation and/or oxidation of a plate provided with holes made of silicon. This oxidation process takes place at high temperatures, typically at temperatures above 1000° C. and is possible since it takes place before manufacturing the electrical devices in the form of integrated circuits so that the temperatures required for oxidizing the polysilicon cannot affect the integrated circuits.

In principle, other types of sealing are also possible. Exemplarily, with a high aspect ratio of the etch channels in the membrane layer, these channels can be sealed by depositing an undoped material.

According to an embodiment, disturbing influences between micromechanics and electrical devices and the accompanying disadvantages are avoided by a suitable selection of the process management in integrated processes with micromechanical structures.

Since the micromechanical device has a planar surface, further manufacturing process steps for manufacturing the integrated circuit can be performed more easily and more reliably, according to an embodiment.

According to an embodiment, preferably, the membrane is located in a recess of the substrate, allowing a planar surface of the structure to be produced without considerably increasing the overall thickness.

According to an embodiment, preferably, the sealing of the at least one channel by the membrane layer takes place by oxidation or nitration of the membrane material so that no additional layer or additional material has to be applied.

Additionally, according to an embodiment, the membrane layer can be manufactured from a semiconductor material, such as, for example, silicon or polysilicon, to exhibit good electrical conductivity.

According to another embodiment, below the first layer, the device includes a doped region so that electrical contacting of the cavity can take place from the substrate side. Along with the good electrical conductivity the membrane layer can exhibit due to its production and sealing of the channels penetrating same completely, electrical contacting of the cavity is possible from both the substrate side and the surface side.

An embodiment of the method for manufacturing a micromechanical device and the structure thereof will be discussed in greater detail referring to FIG. 1.

As can be seen in FIG. 1a, a substrate 100 is provided at first. An oxide layer 110 and, subsequently, a nitride layer 120 are deposited on the substrate 100. The two layers 110, 120 are patterned by means of lithography and an etching step. The nitride layer 120 here serves as a hard-surface mask for etching a recess or depression 125 in the substrate 100 extending, starting from a substrate surface, into the substrate 100. The sacrificial layer thickness and the polymembrane thickness to be formed are adjusted by means of this depression or, more explicitly, its dimensioning. The recess 125 is formed in a region not protected by the patterned nitride layer. A low-resistance well 130 is produced in the substrate 100 opened in this way by means of implantation. Here, the nitride layer 120 also serves as a hard-surface mask. This well 130 serves as a bottom electrode of the micromechanical device to be formed.

In a next process step, another oxide layer 140 covering the substrate surface and the bottom 135 of the recess 125 is deposited. The further oxide layer 140 serves as a sacrificial layer for the cavity structure formed subsequently, the term "sacrificial layer" indicating that parts of the sacrificial layer 140 will be removed in the further course of the manufacturing process to form a cavity 150. The sacrificial layer 140 has a thickness essentially corresponding to the height of the cavity 150 formed subsequently. A silicon layer 160 which is also referred to as membrane layer 160 or silicon membrane or polymembrane provided with holes is deposited on the sacrificial layer 150. Put differently, the depth of the recess is determined by the thickness of the sacrificial layer 140 and the membrane layer 160. Narrow etching holes or channels 170 are etched in the membrane layer 160. The channels 170 here have a diameter of typically 0.05 to 1.0 µm, preferably around 0.2 to 0.4 µm. The channels 170 are also patterned and etched using lithographic methods.

In a next step, the cavity 150 is etched or exposed using a wet-chemical etching through the channels or etching holes 170, so that the result will be the structure illustrated in FIG. 1a.

Figure 1B:
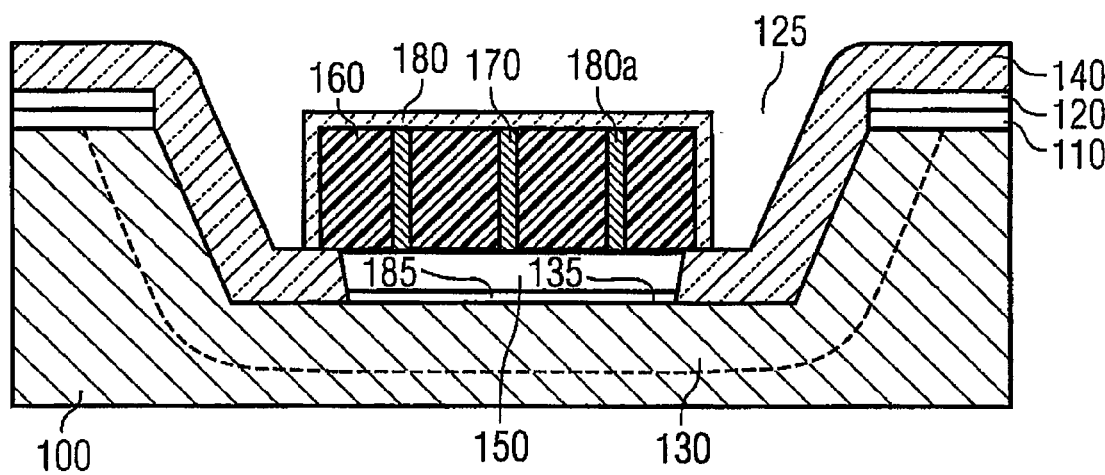

Subsequently, oxidation is performed to further oxidize the membrane layer 160 with the channels 170 so that the membrane layer 160 is covered by a thermal oxide 180 and the holes or channels 170 are sealed, the result of which is the sealed cavity 150. As can be seen, a thin oxide layer 185 has formed on the bottom 135 of the cavity 150 due to oxidation since the channels have not been sealed when the oxidation step began. The sealed channels 170 are illustrated in FIGS. 1b to 1d by the hatched regions 180a. Although in the embodiment shown the channels are completely filled, the present invention is not limited to this. Another possibility of realizing the sealing of the cavity, i.e. of sealing the holes and/or channels 170, is sealing them by depositing a sealing material. The material deposited sealing the cavity may, for example, be formed when depositing a planarization layer so that the material at least partly filling the holes and/or channels 170 also consists of the material of a planarization layer applied subsequently.

In the further course of the process steps, a planarization layer, such as, for example, an oxide layer, is deposited on the structure of FIG. 1c for planarization. In a subsequent chemical-mechanical polishing (CMP) step, the planarization layer is removed to the nitrite layer 120 so that the nitrite layer 120 is exposed and a part 190 of the planarization layer remains in the recess 125. By this, the micromechanical device receives a planar or planarized surface 200. The structure resulting is shown in FIG. 1c.

The nitrite layer 120 is removed in a next process step by means of etching. Subsequently, the oxide layer 110 on the substrate 100, a part of the planarization layer and/or the planarization oxide 190 in the recess, a part of the oxide layer 140 and the thermal oxide 180 on the membrane layer 160 are removed by etching back to produce the planar surface 220. These etching steps can generally be performed without any lithography steps. These etching steps may additionally take place in a highly selective manner relative to the material of the substrate 100 and/or in relation to the membrane layer 160 or polymembrane 160 by performing these etching steps in a wet-chemical manner by corresponding etching solutions exhibiting high selectivity with regard to different materials. The cavity structure with the planar surface 220 resulting is illustrated in FIG. 1d.

Depending on the process conditions, the result may be that the membrane layer is not flush with the surface of the micromechanical device, but exhibits a small step. In the present application, a small step means a difference in height which is typically smaller than 50% and preferably smaller than 20% of the layer thickness of a layer or a structure of the respective device representing the thickest layer of the device.

Subsequently, electrical devices as part of an integrated circuit can be manufactured outside the membrane region, i.e. outside the region in which the cavity structure has been formed.

The cavity 150 is, for example, suitable as a membrane for a pressure sensor. Another way of using same is, for example, increasing the quality of coil elements which may be arranged on the cavity. Here, an interaction of such a coil element with the substrate 100 can be reduced. The principle can be applied to elements which are to be thermally de-coupled from the substrate.

Thus, the present invention provides a novel method for manufacturing a cavity 150 in surface micromechanics in integrated circuits, as may, for example, be employed in micromechanical sensors, like in integrated pressure sensors or different sensors. By using a sealing oxidation, it allows a solution to the problem of being able to manufacture cavities in integrated circuits without influencing electrical devices to be integrated with the cavity structure on a chip by the cavity manufacturing process steps. Among other things, this novel method for sealing cavities allows gas-tight sealing of a corresponding cavity.

According to an embodiment, due to the processing of the cavity structure before processing electrical devices as integrated circuits, it is of particular advantage that the method for manufacturing a micromechanical device according to an embodiment having a region for forming integrated circuits allows a suitable selection of the process management so that mutual disturbing influences between process steps for manufacturing micromechanical structures and process steps for manufacturing electrical devices can be avoided largely. In addition, according to an embodiment, this process management allows avoiding the disadvantageous influence of the characteristics of electrical devices by the processing of micromechanical structures.

Due to the fact that the membrane and/or the membrane layer 160 has been introduced in a substrate recess, i.e. a depression of the substrate 100, very thick membranes or membrane layers 160 having thicknesses of 1 µm or more may, for example, be realized. Typically, membrane layers 160 of thicknesses between 0.5 µm and 20 µm and preferably between 0.9 µm and 2 µm can be realized. After completing the membrane manufacturing, the membrane sealing and planarization, i.e. after completing the membrane process, the micromechanical device has an even planar surface, which is a very important advantage for further processing of the device and, in particular, for processing the integrated circuits. The planar surface of the micromechanical device thus allows a particularly simple and efficient integration of the device in further manufacturing processes, such as, for example, a 0.25 µm process, which is also referred to as quarter micron process. The reason for this is the particularly simple topology which, for example, allows focussing in further lithography steps.

Another embodiment of the method for manufacturing a micromechanical device having a region for forming integrated circuits is selecting the thickness of the membrane layer, i.e. the membrane thickness, such that the micromechanical device can be integrated in a standard STI (shadow trench insulation) CMOS (complementary metal oxide semiconductor) process. Thus, it is possible to accommodate standard STI CMOS trenches in the membrane layer so that no additional silicon etchings (Si etchings) need be performed.

In principle, it is also possible not to place micromechanical devices according to an embodiment having a region for forming integrated circuits in a substrate recess but to locate same on the substrate surface. In this case, the method for manufacturing the corresponding micromechanical device basically differs in the process steps necessary for planarization. Exemplarily, in this case an additional filling layer may be applied on the sealed membrane layer which is then, for example, planarized using an etch-back process or chemical-mechanical polishing (CMP).

Different arrangements of an micromechanical device are also possible according to an embodiment. The cavity manufactured in the inventive method may, for example, be transferred very deep, like, for example, several 10 μm, into the substrate according to an embodiment. According to an embodiment, it is also conceivable for the membrane layer of the micromechanical device to be located directly on the surface of the substrate and/or to have a small thickness to be able to, for example, detect particularly small pressure differences when being used as a pressure sensor.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A micromechanical device comprising a region for forming an integrated circuit, comprising:
    a recess formed in a planar surface of a substrate;
    a first layer in the recess; and
    a membrane layer on the first layer, the membrane layer covering a cavity in the first layer and comprising first and second opposing surfaces; and
    wherein the region for forming the integrated circuit is outside a region in which the membrane layer is formed;
    wherein the first layer and the cavity are located in the recess;
    wherein the first surface of the membrane layer faces the cavity;
    wherein the membrane layer comprises a plurality of laterally alternately arranged first and second regions of different semiconductor material compositions, and wherein the plurality of first and second regions extend between the two surfaces of the membrane layer; and
    wherein the first regions are channel-shaped and comprise a higher concentration of a nitrite, nitride or an oxide of the semiconductor material than the second region.

2. The micromechanical device according to claim 1, wherein the membrance layer comprises silicon and silicon oxide or silicon and silicon nitrite.

3. The micromechanical device according to claim 1, wherein the substrate comprises a doped region below the first layer.

4. The micromechanical device according to claim 1, wherein the second surface of the membrane layer is flush with the planar surface of the substrate, or wherein the second surface of the membrane layer comprises a small step relative to the planar surface of the substrate.

5. A micromechanical device comprising a region for forming an integrated circuit, comprising:
    a first layer on a substrate with a planar surface; and
    a membrane layer on the first layer, the membrane layer covering a cavity in the first layer, the membrane layer comprising two opposing surfaces;
    wherein the region for forming the integrated circuit is outside a region in which the membrane layer is formed;
    wherein one of the surfaces of the membrane layer faces the cavity; and
    wherein the membrane layer comprises a plurality of laterally alternately arranged first and second regions of different semiconductor material compositions,
    the plurality of first and second regions extending between the two opposing surfaces of the membrane layer,
    wherein the first regions are channel-shaped and comprise a higher concentration of a nitrite, nitride or an oxide of the semiconductor material than the second regions.

6. The micromechanical device according to claim 1, wherein the first and second regions comprise different lateral dimensions.

7. A micromechanical device comprising a region for forming an integrated circuit, comprising:
    a recess formed in a planar surface of a substrate;
    a first layer in the recess; and
    a membrane layer in the recess on the first layer, the membrane layer covering a cavity in the first layer, and the membrane layer comprising two opposing surfaces;
    wherein the region for forming the integrated circuit is outside a region in which the membrane layer is formed;
    wherein the cavity is located in the recess;
    wherein one of the surfaces of the membrane layer faces the cavity;
    wherein the other of the two surfaces of the membrane layer is flush with the planar surface of the substrate; and
    wherein the membrane layer comprises a plurality of laterally alternately arranged first and second regions of different semiconductor material compositions, the first regions are channel-shaped and comprise a higher concentration of a nitrite, nitride or an oxide of the semiconductor material than the second regions.

8. The micromechanical device according to claim 7, wherein the cavity is sealed by the membrane layer.

9. A micromechanical device comprising a region for forming an integrated circuit, comprising:
    a first layer on a substrate with a planar surface; and
    a membrane layer on the first layer, the membrane layer covering a cavity in the first layer, and the membrane layer comprising two opposing surfaces;
    wherein the region for forming the integrated circuit is outside a region in which the membrane layer is formed;
    wherein one of the surfaces of the membrane layer faces the cavity;
    wherein the other of the two surfaces of the membrane layer is flush with the planar surface of the substrate; and
    wherein the membrane layer comprises a plurality of laterally alternately arranged first and second regions of different semiconductor material compositions, the first regions are channel-shaped and comprise a higher concentration of a nitrite, nitride or an oxide of the semiconductor material than the second regions.

10. The micromechanical device according to claim 1, wherein the substrate comprising a low-resistance well in the recess, wherein the low-resistance well comprises a doping level greater than the doping level of the substrate, and wherein the low-resistance well is configured to serve as a bottom electrode for the micromechanical device.

11. The micromechanical device, according to claim 1, further comprising a selectively patterned hard-surface mask layer configured between the first layer and the substrate.

* * * * *